United States Patent
Nara et al.

[11] Patent Number: 5,849,441
[45] Date of Patent: Dec. 15, 1998

[54] ALIGNMENT METHOD UTILIZING PLURALITY OF MARKS, DISCRIMINABLE FROM EACH OTHER, CAPABLE OF EFFECTING ALIGNMENT INDIVIDUALLY

[75] Inventors: Kei Nara; Seiji Miyazaki, both of Yokohama; Hideki Koitabashi, Tokyo, all of Japan

[73] Assignee: Nikon Corporation, Tokyo, Japan

[21] Appl. No.: 790,862

[22] Filed: Feb. 3, 1997

[30] Foreign Application Priority Data

Feb. 5, 1996 [JP] Japan ................................. 8-018872

[51] Int. Cl.[6] ...................................................... G03F 9/00
[52] U.S. Cl. .................. 430/22; 430/5; 438/975
[58] Field of Search ........................... 430/5, 22; 438/975

[56] References Cited

U.S. PATENT DOCUMENTS 5,407,763  4/1995  Pai .............................................. 430/22

Primary Examiner—Christopher G. Young
Attorney, Agent, or Firm—Morgan, Lewis & Bockius LLP

[57] ABSTRACT

In order to provide a search alignment method capable of high-speed alignment without a relative movement between an alignment system and a substrate, an alignment mark is constituted by a plurality of element marks having shapes different from each other, the plurality of element marks are provided in such a manner that each two of them has a gap a little shorter than the size of the field of view of the alignment system therebetween, and if even one of the element marks constituting the alignment mark comes into the field of view of the alignment system, said element mark is identified out of all of said element marks, whereby the position of the entire alignment is measured from the position of said one element mark. Therefore, if the alignment mark is moved in a range wider than the field of view of the alignment system, it is possible to detect the position of the alignment mark by one measurement.

7 Claims, 5 Drawing Sheets

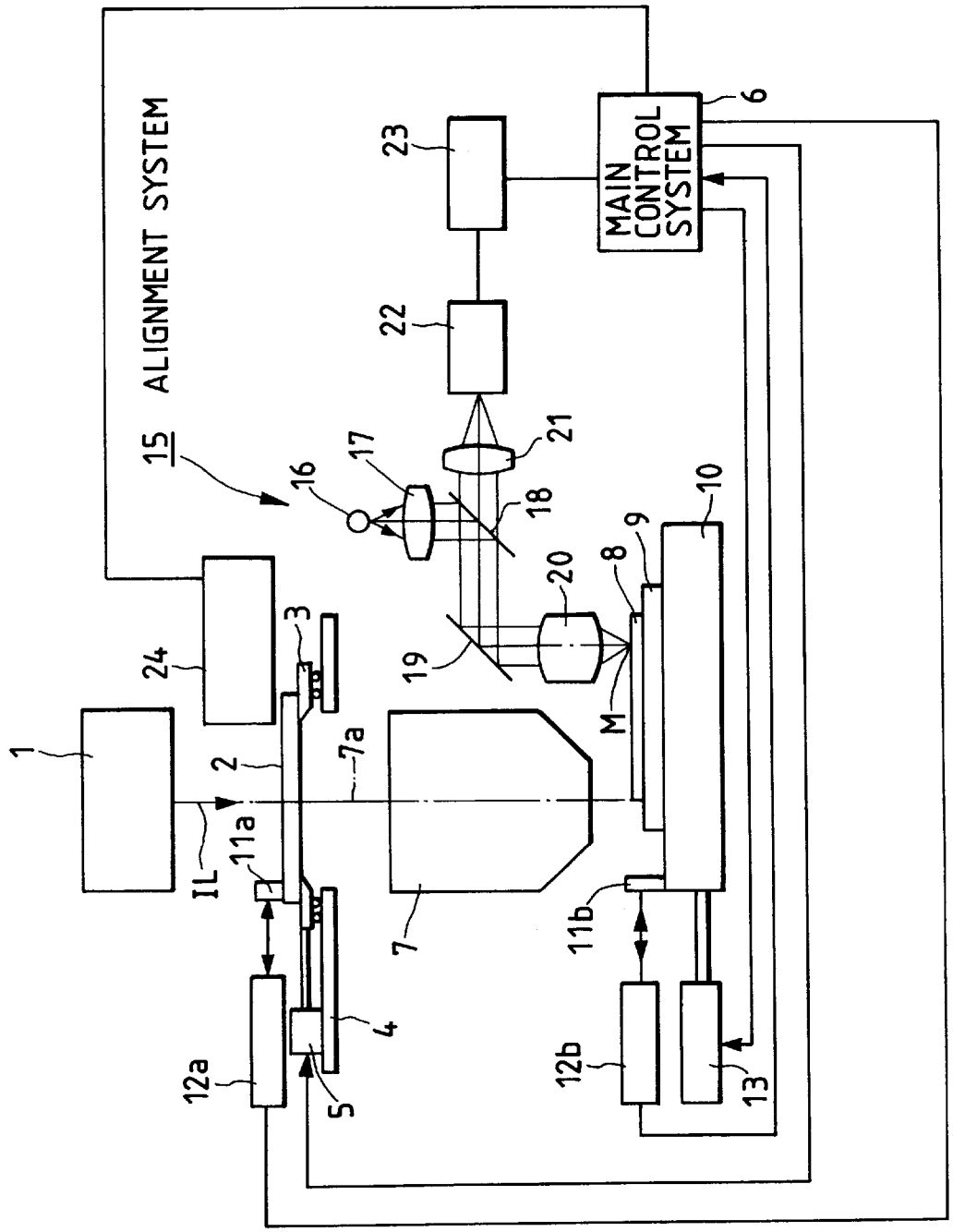

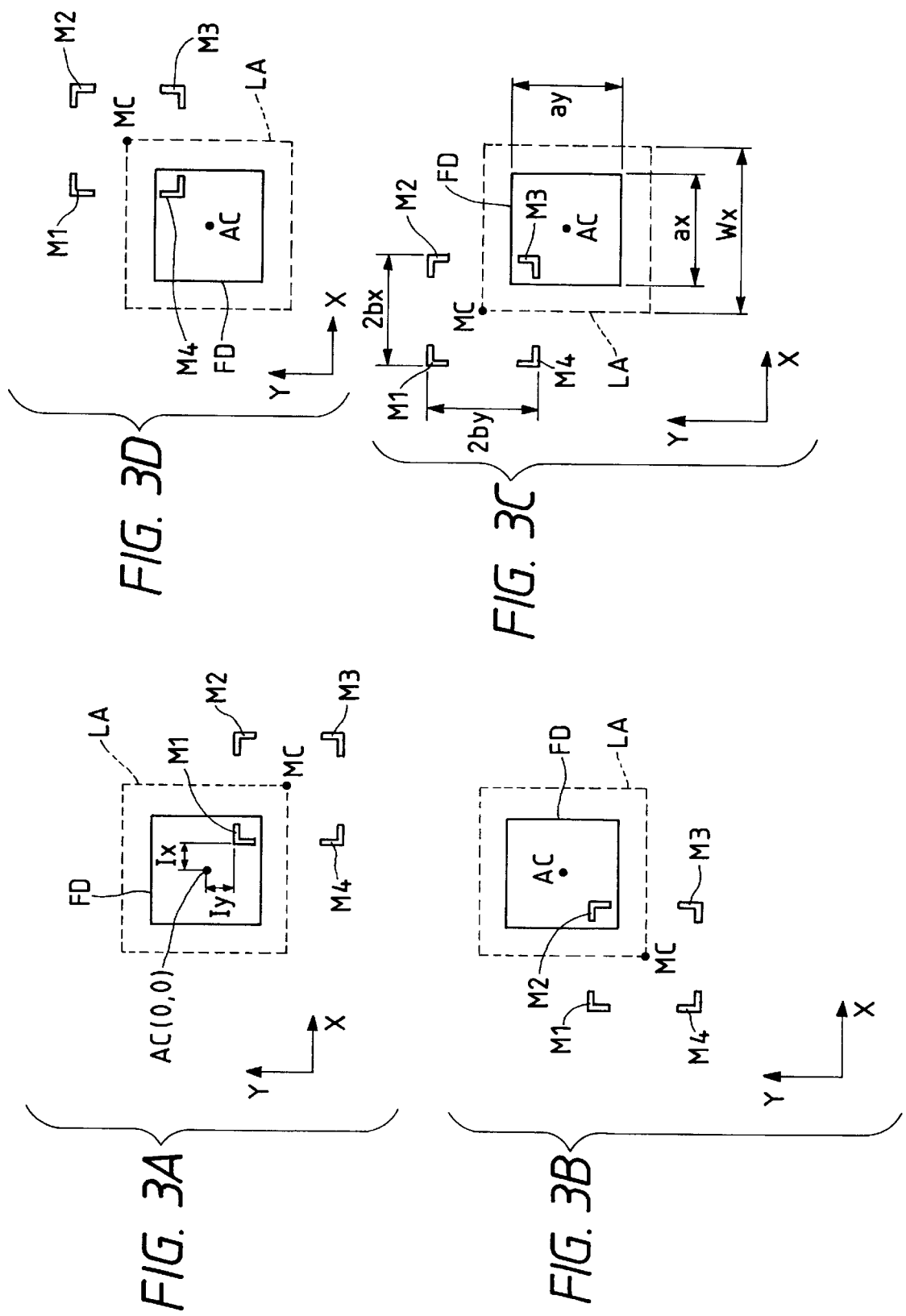

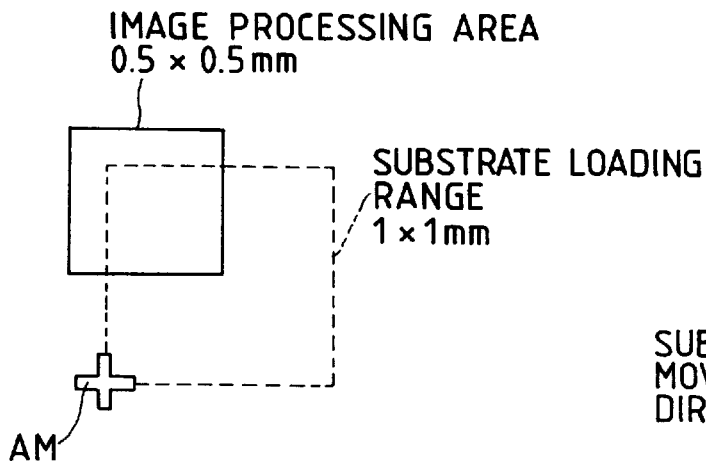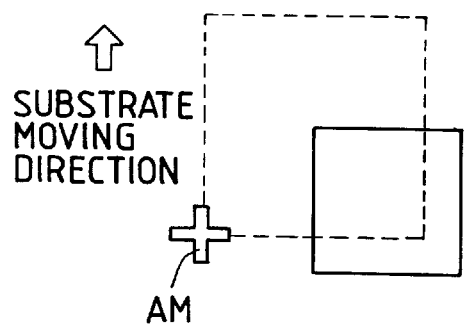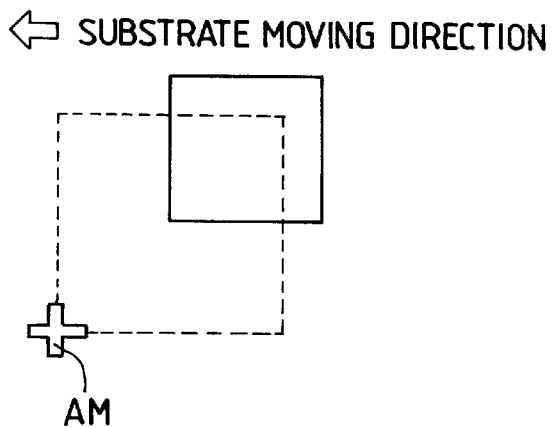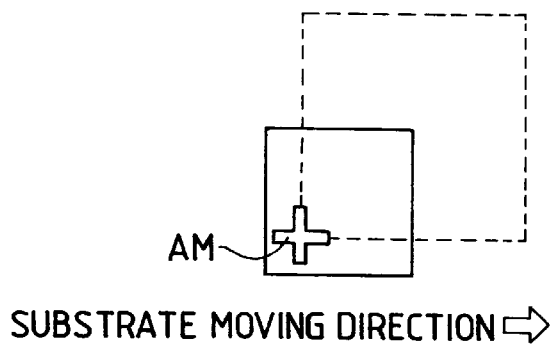
FIG. 5A PRIOR ART
FIG. 5B PRIOR ART
FIG. 5C PRIOR ART
FIG. 5D PRIOR ART

ALIGNMENT METHOD UTILIZING PLURALITY OF MARKS, DISCRIMINABLE FROM EACH OTHER, CAPABLE OF EFFECTING ALIGNMENT INDIVIDUALLY

BACKGROUND OF THE INVENTION

1. Field of the Invention

The present invention relates to an alignment method for positioning a mask or a substrate with respect to an exposure apparatus.

2. Related Background

When a semiconductor device or a liquid crystal display is to be manufactured, a fine pattern which is formed on a mask or a reticle (hereinafter called the mask) is projected and exposed onto a photosensitive substrate such as a wafer or a glass with a photoresist coated thereon, by an exposure apparatus.

Such pattern exposure is normally conducted by exposing another pattern on the pattern which has already been formed on the photosensitive substrate in a superposing manner several times repeatedly. Since an accuracy in the superposition of the patterns has a direct effect on the performance of the device to be manufactured, it is required to align the mask or the photosensitive substrate with the main body of the exposure apparatus, or the mask with the photosensitive substrate with high accuracy of 1 $\mu$m or less. To this end, alignment marks formed on the mask and the photosensitive substrate are detected by an alignment system so that the positions of the mask and the photosensitive substrate are measured, thereby conducting the mutual positioning. The alignment system is, for example, provided with an alignment microscope and an image pick-up device so that the alignment marks enlarged by the alignment microscope are detected by the image pick-up device and image-processed, thereby detecting the alignment marks. The alignment system normally has a narrow field of view of several hundreds um or around since an accuracy in measuring the alignment marks is degraded when the field of view is widened.

Incidentally, the mask or the photosensitive substrate (hereinafter simply called the substrate) is first mounted on a predetermined position of a mask stage or a photosensitive substrate stage of the exposure device by a carrying mechanism such as a robot or the like. However, the positioning accuracy (loading accuracy) of the substrate which is carried and mounted onto the exposure apparatus by the carrying mechanism is in a range from several hundreds $\mu$m to several mm. Especially, since a glass plate (photosensitive substrate) used in an exposure apparats for liquid crystal which manufactures a liquid crystal display device is of a large size of 500×600 mm or around, the above-mentioned positioning accuracy (loading accuracy) becomes more liable to be degraded. Accordingly, the position of the substrate mounted on the mask stage or the substrate stage is detected by use of the alignment system by an operation called a search alignment, so that said substrate is re-positioned with the positioning accuracy of several $\mu$m or the like.

For the search alignment, it is necessary to measure an alignment mark which exists somewhere on the substrate in a comparatively wide area, compared with the field of view of the alignment system, with accuracy of several $\mu$m or around, so that said area is divided into a several blocks in order to conduct the alignment.

Description will be made, with reference to FIGS. 5A to 5D, on an operation for measuring the position of an alignment mark (substrate) with the loading accuracy of ± 0.5 mm (1 mm in all directions) by use of the alignment system which has the field of view (processing range) of 0.5 mm in all directions.

Since the position of an alignment mark AM in a substrate loading range of 1×1 mm indicated by the broken line in each of FIGS. 5A to 5D, is not known, it is assumed that the field of view of the alignment system is first set at the position indicated by the solid line in FIG. 5A. In this case, if the alignment mark does not exist in the field of view of the alignment system, the substrate and the alignment system are relatively moved by, for example, moving the substrate stage by a distance substantially equivalent to the size of said field of view, as indicated by the arrow in FIG. 5B, so as to conduct the search and the measurement of the alignment mark. On this occasion, an amount of movement of the substrate is monitored by a position monitoring means such as a laser interferometer or the like, to be used as an offset for the measurement of the alignment mark. If the alignment mark AM is not found within the field of view of the alignment system even in a state shown in FIG. 5B, the substrate is repeatedly moved, as indicated by the arrow in FIG. 5C and FIG. 5D, until the alignment mark comes into the field of view. When the alignment mark comes into the field of view, the image of said alignment mark is processed and the position of the alignment mark in the field of view of the alignment system is measured. Then, the amount of movement of the substrate up to that time is added as the offset to a measurement value obtained by said position measurement, whereby the position of the alignment mark AM, i.e. the position of the substrate is detected.

Since it is necessary to cover a wide area by use of an alignment system having a narrow field of view according to a conventional alignment method as described above, the search and the position measurement of an alignment mark is conducted by dividing a range in which the alignment mark is expected to exist into a plurality of areas. Therefore, a time required for the alignment (measurement) is increased.

Also, when the field of view of the alignment system and the substrate are relatively moved, a measuring device for monitoring an amount of such movement is required. Also, an accuracy in such measurement is required to be as high as that required for the alignment.

SUMMARY OF THE INVENTION

Taking the problems of the prior art stated above into consideration, an object of the present invention is to provide a search alignment method which allows a high-speed alignment without a relative movement between an alignment system and a substrate.

The above object is achieved, according to the present invention, by composing an alignment mark of a plurality element marks having different shapes from each other, and providing a gap which is a little shorter than the dimension of the field of view of an alignment system between each two adjacent ones of these plurality of element marks.

More specifically, the present invention is characterized in that, in an alignment method in which an alignment mark formed on a substrate is picked up by an image pick-up device and the position of the alignment mark is measured so as to position the substrate, the alignment mark is comprised of a set of a plurality of element marks having different shapes from each other and a gap between each two adjacent one of said element marks is made smaller than the dimension of the field of view of the image pick-up device.

When the gap between each two adjacent ones of the element marks is set to be a little smaller than the dimension of the field of view of the image pick-up device, it becomes possible to cover a wide loading range.

The alignment mark according to the present invention may be comprised of, for example, four element marks which are provided at the respective apexes of a rectangular area. However, the layout or the number of the element marks may be set arbitrarily so long that the positional relationship between the element marks in the alignment mark can be specified.

According to the present invention, if even one of the element marks constituting the alignment mark comes into the field of view of the alignment system, since all of the element marks take specific shapes different from each other so that the other element marks can also be identified, the positions of all of the element marks can be measured. As a result, the entire alignment mark position can be measured. Therefore, even if the alignment mark moves in a range wider than the field of view of the alignment system, the position of the alignment mark can be obtained by one measuring operation.

BRIEF DESCRIPTION OF THE DRAWINGS

FIG. 1 is a schematic view of an exposure apparatus;

FIGS. 3A to 3D are views for explaining a search alignment using the alignment mark in FIGS. 2A and 2B;

FIGS. 5A and 5D are views for explaining a search alignment according to the prior art.

DESCRIPTION OF THE PREFERRED EMBODIMENTS

Figure 2A:
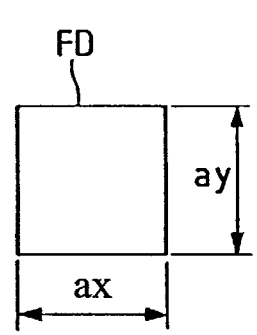
FIGS. 2A and 2B are views for showing a configuration of an alignment mark according to the present invention.

Embodiments of the present invention will be described with reference to the attached drawings.

FIG. 1 shows a schematic view of liquid crystal exposure apparatus for manufacturing a liquid crystal display device. An exposure light IL emitted from an illumination optical system 1 illuminates a mask 2 having a pattern and an alignment mark with a substantially uniform intensity of illumination. The mask 2 is held on a mask stage 3, and the mask stage 3 is movably supported within a two-dimensional plane on a base 4. A moving mirror 11a is fixed to the mask stage 3, and a laser interferometer 12a is provided opposite to this moving mirror 11a. X and Y coordinates of the mask stage 3 measured by this laser interferometer 12a, are supplied to a main control system 6. The mask stage 3 is moved by a driving device 5 under the control of the main control system 6 which controls the operation of the entire apparatus.

Under the exposure light IL, a pattern image of the mask 2 is projected onto a photosensitive substrate 8 through a projection optical system 7. In this embodiment, a glass plate which is about 500×600 mm in size and about 1.1 mm in thickness is used as the photosensitive substrate 8. The photosensitive substrate 8 is mounted on a photosensitive substrate stage 10 through a holder 9. The moving mirror 11b is fixed to the upper surface of the photosensitive substrate stage 10, and the laser interferometer 12b is provided opposite to the moving mirror 11b. The coordinate axes perpendicular to each other within a plane perpendicular to the optical axis 7a of the projection optical system 7 are respectively called the X and Y axes, and two sets of the moving mirrors 11b and the laser interferometers 12b are provided for said X and Y axes. The X and Y coordinates of the photosensitive substrate stage 10 are measured by these two sets of laser interferometers 12b. The information on the X and Y coordinates measured by the laser interferometers 12b are supplied to the main control system 6, and the main control system 6 controls a positioning operation of the photosensitive substrate stage 10 through the driving device 13, while monitoring the supplied coordinates.

An off-axis alignment system 15 is provided on the side surface of the projection optical system 7. In this alignment system 15, an illumination light from a light source 16 is applied to the vicinity of an alignment mark M on the photosensitive substrate 8 through a collimator lens 17, a beam splitter 18, a mirror 19, and an objective lens 20. The light reflected by the alignment mark M is collected to form an image on an image pick-up surface of an image pick-up device 22 such as a two-dimensional CCD or the like through the objective lens 20, the mirror 19, and a lens 21. An image pick-up signal of the image pick-up device 22 is supplied to an image processing apparatus 23, and the image processing apparatus 23 recognizes the alignment mark M by a known image recognizing technique such as the correlation method, so as to detect the position of said alignment mark M within the field of view of the apparatus. The positional information of the alignment mark M detected by the image processing apparatus 23 is supplied to the main control system 6 and is combined with the X- and Y-coordinate information of the photosensitive substrate stage 10 supplied from the laser interferometers 12b, whereby the control system 6 obtains the coordinates of the alignment mark M on the stage coordinate system (X, Y). Note that another alignment apparatus 24 is provided on the reticle 2 side for detecting an alignment mark formed on the reticle 2. This alignment apparatus 24 also has an alignment optical system and an image processing apparatus.

After the photosensitive substrate 8 is mounted on the photosensitive substrate stage 10 by a carrying device (not shown), the coordinates of the alignment mark M on the photosensitive substrate 8 is detected as stated above, and a search alignment for positioning photosensitive substrate stage 10 is conducted by driving the driving device 13 in such a manner that said coordinates take predetermined values. In this embodiment, the alignment system 15 or the alignment apparatus 24 has the view field of detection for detecting an alignment mark which takes a rectangular shape of 0.5×0.5 mm.

Figure 2B:
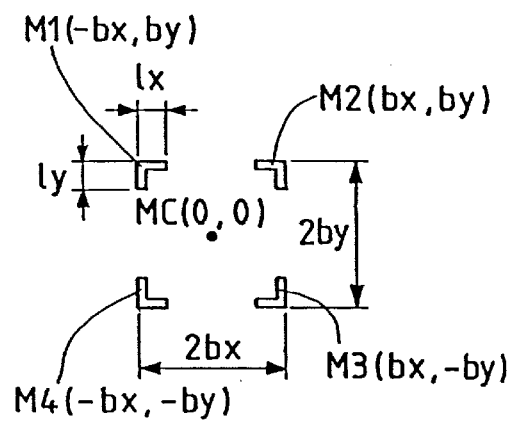

FIGS. 2A and 2B are views for explaining a configuration of an alignment mark according to the present invention. The field of view FD of the alignment system takes a rectangular shape which has dimensions of "ax" along the X axis and "ay" along the Y axis in the stage coordinate system (X, Y), as shown in FIG. 2A. The alignment mark consists of four element marks M1 to M4 which have different shapes from each other provided on the four apexes of the rectuangular area. The four element marks M1 to M4 are provided to have gaps "2bx" and "2by" therebetween, which gaps are smaller than the dimensions "ax" and "ay" of the field of view FD of the alignment system in the X and Y directions. That is, when the dimension of each of the element marks M1 to M4 in the X direction is set to "lx", and that in the Y direction to "ly", the element marks M1 to M4 are provided in such a manner that the following Formula (1) can be satisfied:

$$ax \geq 2bx;\ \text{and}$$

$$ay \geq 2by \tag{1}$$

The coordinate positions of the element marks M1 to M4 of the alignment mark are denoted by M1 (−bx, by), M2 (bx, by), M3 (bx, −by), and M4 (−bx,−by) when the origin (0, 0) is set to the center MC of the alignment mark.

The method of search alignment using the alignment marks M1 to M4 shown in FIGS. 2A and 2B will be described with reference to FIGS. 3A to 3D. As a rotating error in loading of the substrate onto the exposure apparatus by the carrying device, is extremely small, only a loading error in the direction of translation, that is, a loading error in the X-axial and Y-axial directions, will be taken into consideration in the following description. In each of FIGS. 3A to 3D, a rectangle indicated by a solid line represents the field of view FD of the alignment system, while another rectangle indicated by a broken line represents the loading range LA of the substrate by use of the carrying mechanism. The mark center MC of the alignment mark is positioned somewhere in this loading range LA.

FIG. 3A shows a case in which the center MC of the alignment mark is positioned at the lower right corner of the substrate loading range LA. When an alignment mark which is solely positioned at the MC, as in a conventional example, is used, said alignment mark does not come into the field of view of the alignment system in this state and it is impossible to know in which direction the alignment mark lies outside the field of view. However, when an alignment mark which consists of a set of four element marks as shown in FIGS. 2A and 2B is used, even if the center MC of the alignment mark comes off from the field of view, at least one element mark M1 comes into the field of view. Then, since all of the element marks M1, M2, M3 and M4 have different shapes from each other, it is possible to know where the element mark positioned in the field of view is with respect to the mark center MC.

In the image processing, the mark coming into the field of view is identified as the element mark M1 by, for example, the correlation method, and then a position "Ix, Iy" from the center AC of the field of view to the element mark M1 is measured. Then, a distance "Δx" in the X-axial direction and a distance "Δy" in the Y-axial direction from the center AC of the field of view of the alignment system to the center MC of the alignment mark are calculated by the following Formula (2). The position of the substrate on the stage is re-positioned by the main control system 6 to have a predetermined accuracy on the basis of the information on Δx and Δy obtained by the Formula (2):

$$\Delta x = Ix + bx;\ \text{and}$$

$$\Delta y = Iy - by \tag{2}$$

FIG. 3B shows a state in which the center MC of the alignment mark is positioned at the lower left corner of the loading range LA and the element mark M2 is within the field of view of the alignment system. In this case, the distance "Δx" in the X-axial direction and the distance "Δy" in the Y-axial direction from the center AC of the field of view of the alignment system to the center MC of the alignment mark are calculated by the following Formula (3):

$$\Delta x = Ix - bx;\ \text{and}$$

$$\Delta y = Iy - by \tag{3}$$

In the same manner, when the element mark M3 is within the field of view of the alignment mark, as shown in FIG. 3C, the distance "Δx" in the X-axial direction and the distance "Δy" in the Y-axial direction from the center AC of the field of view of the alignment system to the center MC of the alignment mark are calculated by the following Formula (4):

$$\Delta x = Ix - bx;\ \text{and}$$

$$\Delta y = Iy + by \tag{4}$$

Also, as shown in FIG. 3D, when the element mark M4 is within the field of view of the alignment system, the distance "Δx" in the X-axial direction and the distance "Δy" in the Y-axial direction from the center AC of the field of view of the alignment system to the center MC of the alignment mark are calculated by the following Formula (5):

$$\Delta x = Ix + bx;\ \text{and}$$

$$\Delta y = Iy + by; \tag{5}$$

On the other hand, the maximum distances between adjacent element marks are 2bx, 2by when the equation in the Formula (1) is satisfied. This maximum distances can be calculated from the Formula (1) by the following Formula (6):

$$2bx = ax;\ \text{and}$$

$$2by = ay \tag{6}$$

In addition, a moving range Wx in the X-axial direction and Wy in the Y-axial direction of the alignment mark the position of which can be measured by one image processing operation will be calculated by the following Formula (7):

$$Wx = ax + 2bx - 2lx;\ \text{and}$$

$$Wy = ay + 2by - 2ly \tag{7}$$

In this case, since "lx" and "ly" are sufficiently smaller than "ax" and "ay", the Formula (7) can be expressed as the Formula (8):

$$Wx \approx 2ax;\ \text{and}$$

$$Wy \approx 2ay \tag{8}$$

The Formula (8) shows that the same effect as that obtained by enlarging only the field of view 2×2 times can be obtained by employing the alignment mark as shown in FIGS. 2A and 2B by widening the field of view of the alignment system without degrading an accuracy in measurement.

Figure 4:
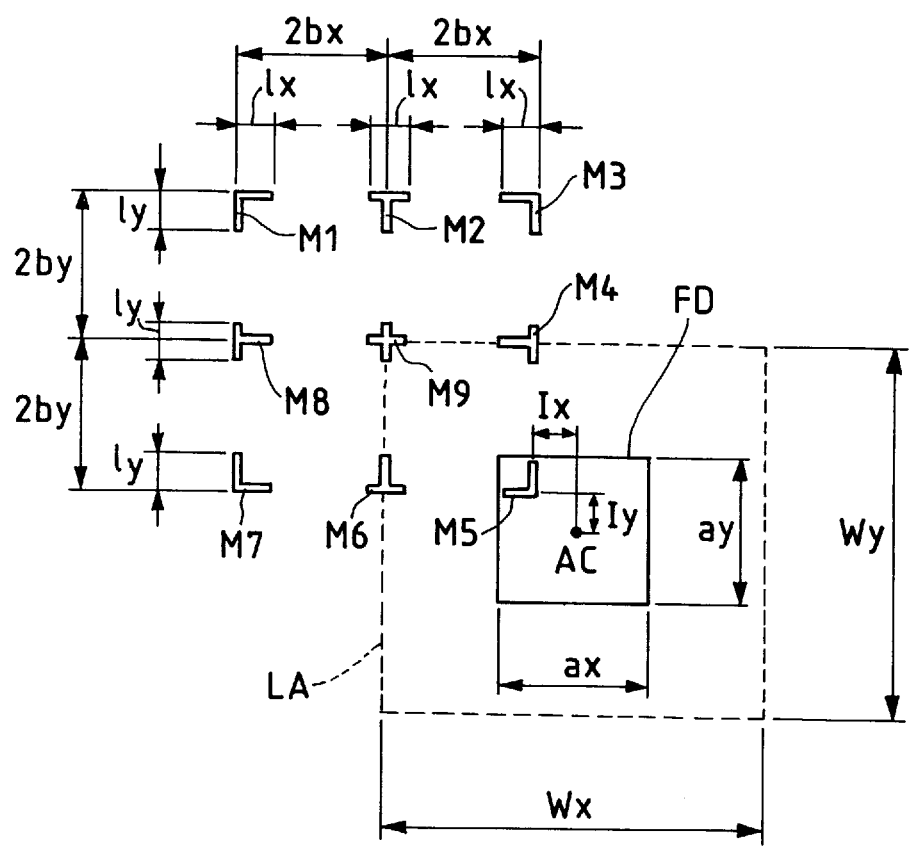
FIG. 4 is a view for showing another configuration of the alignment mark according to the present invention.

FIG. 4 is a view for explaining another configuration of the alignment mark according to the present invention. The field of view FD of the alignment system takes a rectangular shape having dimensions "ax" in the X-axial direction and "ay" in the Y-axial direction in the stage coordinate system (X, Y). The alignment mark in this example consists of nine element marks M1 to M9 which take different shapes from each other positioned at the center, the four apexes and the median points of the respective four sides of the rectangular area. Each two adjacent ones of said element marks are separated from each other in the X direction and the Y direction only by distances "2bx" and "2by" which are smaller than the dimensions "ax" and "ay" of the field of view FD of the alignment mark. That is, when the X-directional dimension of each of the element marks M1 to M9 is "lx" and the Y-directional dimension thereof "ly", the element marks M1 to M9 are provided in such a manner that the above-mentioned Formula (1) can be satisfied.

The coordinate positions of the element marks M1 to M9 of the alignment mark are respectively represented by M1 (−2bx, 2by), M2 (0, 2by), M3 (2bx, 2by), M4 (2bx, 0), M5 (2bx, −2by), M6 (0, −2by), M7 (−2bx, −2by), and M8 (−2bx, 0), when the origin (0, 0) of the coordinate system is set to the position of the element mark M9, i.e., the center of the alignment mark.

The mark gap "2bx, 2by" is set to be substantially equal to or a little smaller than the field of view "ax, ay" of the alignment system. The measurable range LA obtained at this time is calculated by the following Formula (9):

$$Wx \approx 3ax; \text{ and}$$

$$Wy \approx 3 ay \qquad (9).$$

The Formula (9) shows that the same effect as that obtained when only the field of view is enlarged 3×3 times can be obtained by widening the field of view of the alignment system without degrading the measuring accuracy, if the alignment mark consisting of nine element marks as shown in FIG. 4, is employed.

The detection of the element marks, calculation of the distance "Δx" in the X-axial direction and the distance "Δy" in the Y-axial direction up to the center of the alignment mark, and the positioning of the substrate on the stage based on the obtained information on "Δx" and "Δy" are conducted in the same manner as described before. In the case shown in FIG. 4, first a mark in the field of view is identified as the element mark M5 by the image processing, and then the position "Ix, Iy" from the center AC of the field of view to the element mark M5 is measured. Subsequently, the distance "Δx" in the X-axial direction and the distance "Δy" in the Y-axial direction from the center AC of the field of view to the center of the alignment mark are calculated by the following Formula (10). The position of the substrate on the stage is re-positioned by the main control system 6 to have a predetermined accuracy on the basis of the information on "Δx" and "Δy" obtained by the Formula (10):

$$\Delta x = Ix - 2bx; \text{ and}$$

$$\Delta y = Iy + 2by \qquad (10).$$

In the above, description was made on the alignment mark consisting of a set of four element marks and the alignment mark consisting of a set of nine element marks. However, the number of element marks is not limited to four or nine. Any number and any layout of element marks can be allowed for constituting an alignment mark so long that they are within the scope of the concept of the present invention. As described, each of the alignment marks of the mask 2 and the photosensitive substrate 8 is formed of a plurality of element marks, so that a time required for search alignment of the mask 2 and for the photosensitive substrate 8 can be reduced. Note that it is possible to constitute either the alignment marks of the mask 2 or those of the photosensitive substrate 8 by a plurality of element marks.

After this search alignment, a fine alignment is conducted, and subsequently, a pattern image of the mask 2 is projected onto the photosensitive substrate 8 by the projection optical system 7.

In this embodiment, the field of view FD of the alignment system is arranged to take a rectangular shape of 0.5 mm×0.5 mm. However, if the size of the field of view FD is increased (for example, 1 mm×1 mm), the alignment mark consisting of a plurality of element marks of this embodiment can be effectively employed.

Further, it is needless to say that the alignment mark consisting of a plurality of element marks of this embodiment can be applied to any exposure apparatus other than the liquid crystal exposure apparatus.

According to the present invention, it is possible to measure the position within a range wider than the field of view of an alignment system without enlarging said field of view, and to reduce a time for measurement in the search alignment. Also, since the range of measurement is not divided into a plurality of areas, a mechanism for relatively moving the substrate and the alignment system, or means for monitoring the positions of such substrate and alignment system is no longer necessary.

In addition, especially, it is effective to apply the alignment marks having a plurality of element marks according to the embodiment, to a scan-type of liquid crystal exposure apparatus comprising a plurality of projection optical systems forming erect real images having a unit magnification, and carriages for integrally holding a mask and a glass plate vertically, wherein said carriages are moved (scanned) with respect to said plurality of projection optical systems, thereby to expose a pattern of the mask. The reason thereof is in that the mask used in the scan-type of exposure apparatus, has a size of 500×600 mm or around, and weighs about 10 kg, so a position accuracy on carrying the mask is apt to be degraded.

What is claimed is:

1. An alignment method comprising the steps of:

disposing a substrate having an alignment mark including a plurality of element marks, each being capable of effecting alignment individually and each having different shapes from each other to be discriminable from each other; and detecting any one of said element marks to determine the position of said alignment mark.

2. An alignment method according to claim 1, wherein a distance between two adjacent element marks out of said plurality of element marks is smaller than a dimension of a field of view.

3. An alignment method according to claim 2, wherein said detecting step is conducted by an image pick-up device having a field of view of a predetermined dimension.

4. An alignment method according to claim 1, wherein said alignment mark is constituted by nine element marks.

5. An alignment method according to claim 3, wherein said alignment mark is constituted by nine element marks.

6. An alignment method according to claim 1, wherein said substrate is a mask with a pattern formed thereon.

7. An alignment method comprising the steps of:

disposing a mark having positional information within an exposure range; and adopting said mark as an alignment mark, depending on shape.

* * * * *